(12) United States Patent
Law et al.

(10) Patent No.: US 8,708,710 B2
(45) Date of Patent: Apr. 29, 2014

(54) CONTACT CONFIGURATION FOR UNDERTAKING TESTS ON CIRCUIT BOARD

(75) Inventors: Che Seong Law, Penang (MY); Kaneasan Edumban, Penang (MY)

(73) Assignee: Spansion LLC, Sunnyvale, CA (US)

( * ) Notice: Subject to any disclaimer, the term of this patent is extended or adjusted under 35 U.S.C. 154(b) by 725 days.

(21) Appl. No.: 11/881,969

(22) Filed: Jul. 30, 2007

(65) Prior Publication Data

US 2009/0033334 A1    Feb. 5, 2009

(51) Int. Cl.
*H01R 12/00*    (2006.01)
(52) U.S. Cl.
USPC .............................. 439/60; 439/951
(58) Field of Classification Search
USPC ........ 439/62, 74, 631, 633, 637, 636, 60, 951
See application file for complete search history.

(56) References Cited

U.S. PATENT DOCUMENTS

| | | | | |
|---|---|---|---|---|
| 2,959,758 A | * | 11/1960 | Kehl et al. | 439/55 |
| 4,298,237 A | * | 11/1981 | Griffith et al. | 439/60 |
| 4,794,243 A | * | 12/1988 | Hamada | 235/492 |
| 5,051,099 A | * | 9/1991 | Pickles et al. | 439/108 |
| 5,239,748 A | * | 8/1993 | Hamilton | 29/843 |
| 5,764,489 A | * | 6/1998 | Leigh et al. | 361/777 |
| 5,772,448 A | * | 6/1998 | Ekrot et al. | 439/60 |
| 6,382,983 B2 | * | 5/2002 | Koyama et al. | 439/62 |
| 6,994,563 B2 | * | 2/2006 | Amini et al. | 439/62 |
| 7,018,224 B2 | * | 3/2006 | Reisinger et al. | 439/181 |
| 7,172,465 B2 | * | 2/2007 | Kinsley | 439/637 |
| 7,455,531 B2 | * | 11/2008 | Hirabayashi et al. | 439/67 |
| 8,298,009 B2 | * | 10/2012 | Elkhatib et al. | 439/581 |

* cited by examiner

*Primary Examiner* — Neil Abrams
*Assistant Examiner* — Phuongchi T Nguyen (57) ABSTRACT

An electronic structure (for example a reliability board or a cycling control module) has a body including a body portion insertable into a connector. A plurality of contact structures are provided on a side of the body portion, each contact structure comprising a first contact and a second contact spaced from the first contact, with the first and second contacts of each contact structure being aligned in the direction of insertion of the body portion into the connector. A corresponding second plurality of contact structures is provided on a side of the body portion opposite the first-mentioned side. These contacts connect with respective corresponding contacts of the connector.

12 Claims, 7 Drawing Sheets

CONTACT CONFIGURATION FOR UNDERTAKING TESTS ON CIRCUIT BOARD

BACKGROUND OF THE INVENTION

1. Technical Field

This invention relates generally to testing of electronic devices, and more particularly, to contact structure for undertaking tests on circuit boards.

2. Background Art

Figure 1:
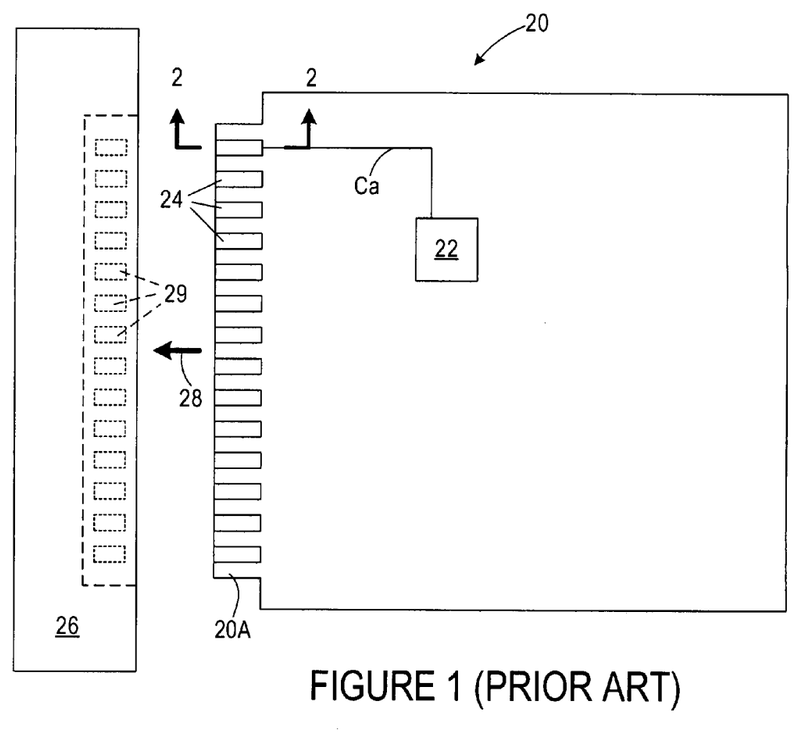
FIG. 1 is a plan view of a conventional reliability board illustrating insertion of a portion thereof into a connector.
Figure 2:
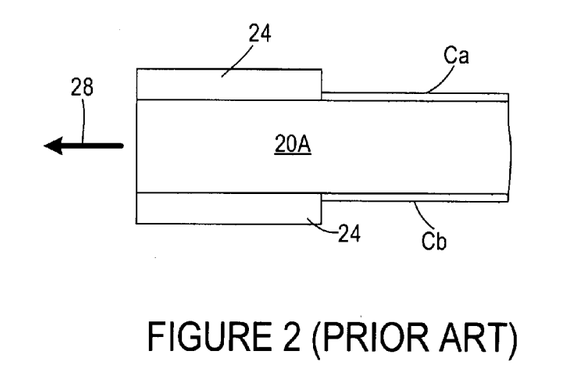
FIG. 2 is a sectional view taken along the line 2-2 of FIG. 1.

FIG. 1 illustrates a typical reliability board 20 which includes a number of semiconductor devices inserted in test sockets for testing thereof (one device shown at 22). The board 20 has a portion 20A on which elongated contacts 24 are formed on opposite sides thereof (FIGS. 1 and 2). As is well known, the contacts 24 on one side of the portion 20A are formed in a row, and the contacts on the opposite side of the portion 20A are also formed in a row. The contacts 24 are of highly conductive material, for example gold. The contacts 24 connect to the devices by means of conductive lines (for example conductive lines Ca, Cb connecting device 22 with respective contacts 24).

Figure 3:
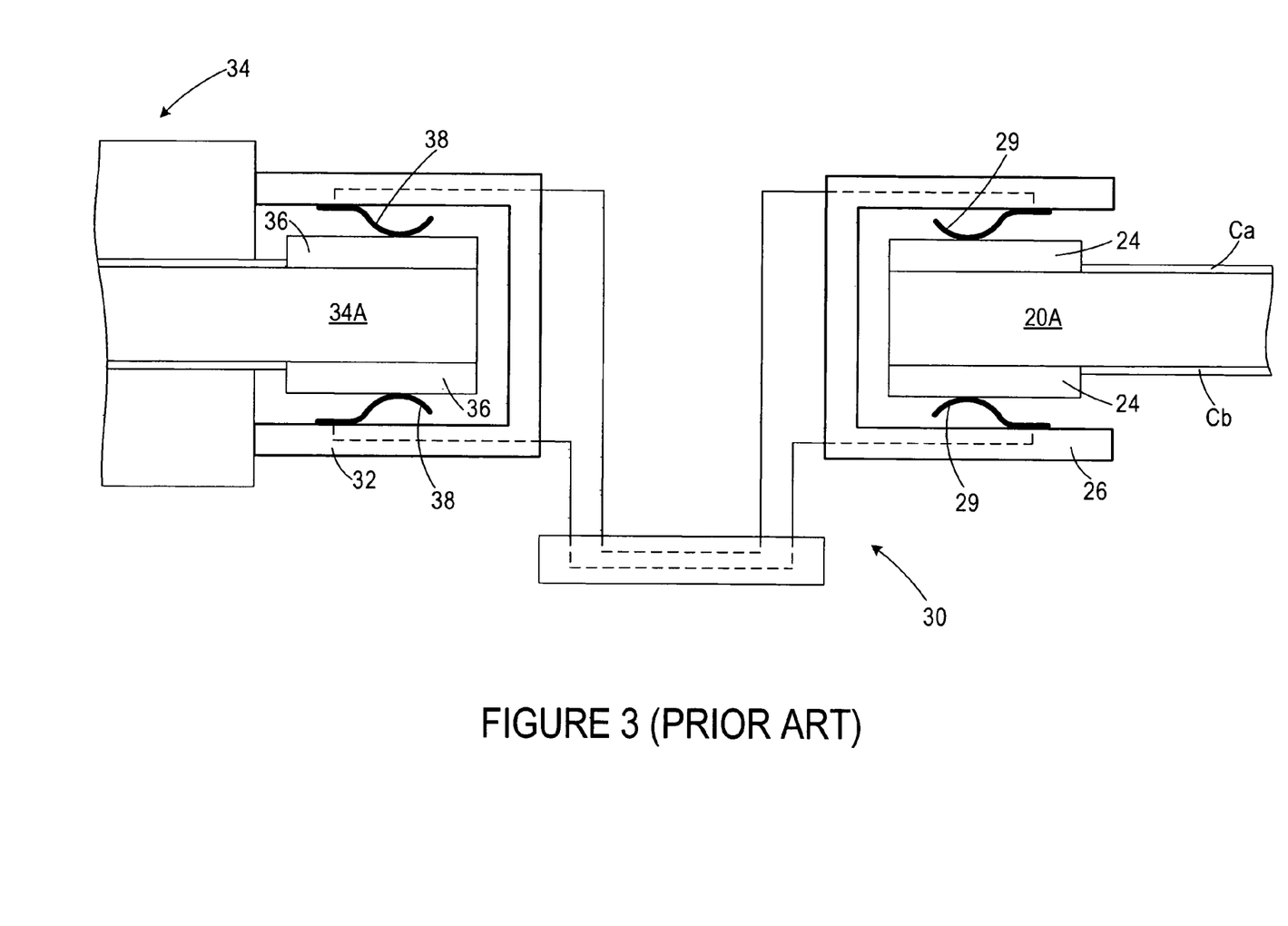
FIG. 3 is a sectional view of illustrating connections of a conventional reliability board, feed though device, and control module.

The portion 20A of the board 20 is insertable into a connector 26 in the direction indicated by the arrow 28. The connector 26 includes a plurality of contacts 29 which engage with respective corresponding contacts 24 on the board portion 20A. The connector 26 is part of a feed though device 30, which includes another connector 32 electrically connected to the connector 26 (FIG. 3).

A control module 34 also has a portion 34A on which elongated contacts 36 are formed on opposite sides thereof, similar to the contacts 24 on the portion 20A of the board 20. This portion 34A of the module 34 is insertable into the connector 32, which includes a plurality of contacts (two shown at 38) which engage with respective corresponding contacts 36 on the module portion 34A. In this way, the control module 34 electrically communicates with the devices on the board 20 and may run through testing cycles for running, for example, High Temperature Operating Life test (HTOL), Highly Accelerated Life Test (HAST), and Write Erase Endurance test (ED) of the devices.

As devices become more complex and the number of devices on board has increased, the number of contacts on the board 20, the control module 34, and the connectors 26, 32 respectively associated therewith has increased substantially. For proper testing to be undertaken, there is a limit in the reduction of contact width (as measured along the elongated edge of for example the portion 20A). This results in the contacts being brought closer and closer together in order in increase contact count. In the event of even a slight misalignment of the board 20 with the connector 26, or the module 34 with the connector 32, improper connection of contacts may be made, resulting in improper signals being provided in testing.

Therefore, what is needed is an approach wherein contact count may be increased, but with it being insured that proper connection of contacts is maintained.

DISCLOSURE OF THE INVENTION

Broadly stated, the present electronic structure comprises a body having a body portion insertable into a connector, and a contact structure on a side of the body portion, each contact structure comprising a first contact and a second contact spaced from the first contact. The first and second contacts of each contact structure are aligned in the direction of insertion of the body portion into the connector.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 4:
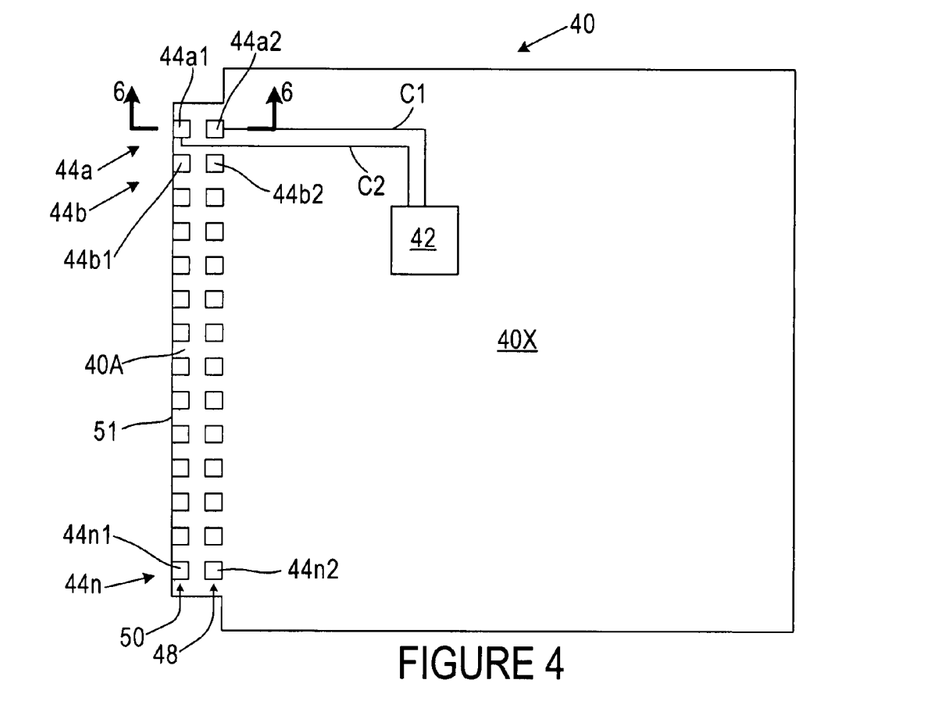
FIG. 4 is a plan view of a side of the present reliability board.
Figure 5:
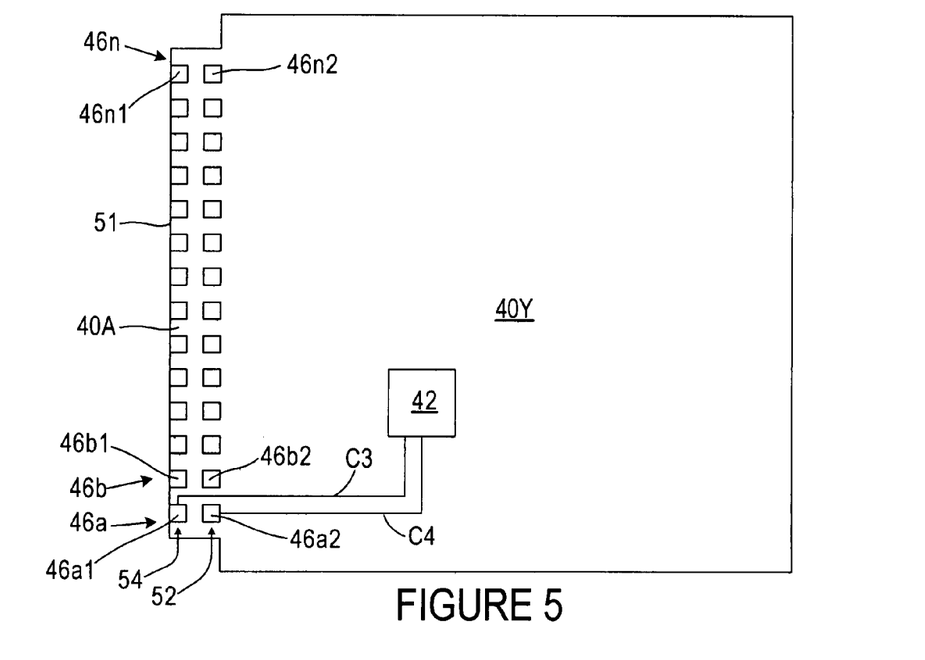
FIG. 5 is a plan view of the opposite side of the present reliability board.

FIGS. 4 and 5 illustrate the opposite sides 40X, 40Y of the present reliability board 40. The reliability board 40 includes an extended body portion 40A. A number of semiconductor devices are inserted in test sockets in the board 40 for testing thereof (one device shown at 42). The body portion 40A has a plurality of contact structures 44a, 44b, . . . 44n on and touching one side 40X thereof, each contact structure including a pair of spaced apart contacts (for example contact structure 44a including contacts 44a1, 44a2, contact structure 44b including contacts 44b1, 44b2, etc.). Similarly, a plurality of contact structures 46a, 46b, . . . 46n are provided on and touching the opposite side 40Y of the body portion 40A, each contact structure including a pair of spaced apart contacts (for example contact structure 46a including contacts 46a1, 46a2, contact structure 46b including contacts 46b1, 46b2, etc.). Each contact on one side is positioned over a respective contact on the other side.

The contacts 44a2, 44b2, . . . 44n2 make up a row 48 of contacts on the side 40X of the portion 40A, and the contacts 44a1, 44b1, . . . 44n1 also make up a row 50 of contacts on that side 40X of the portion 40A, closer to the edge 51 of the body portion 40A than the row 48 of contacts. Likewise, the contacts 46a2, 46b2, . . . 46n2 make up a row 52 of contacts on the opposite side 40Y of the portion 40A, and the contacts 46a1, 46b1, . . . 46n1 also make up a row 54 of contacts on that opposite side 40Y of the portion 40A, closer to the edge 51 of the body portion 40A than the row 52 of contacts.

Figure 6:
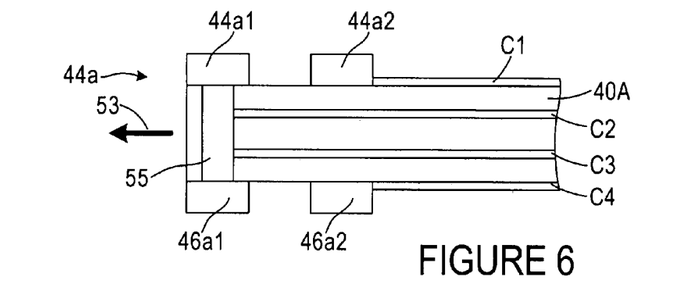
FIG. 6 is a sectional view taken along the line 6-6 of FIG. 4.

As shown in FIG. 6, the signal lines C1, C4 (connecting the device 42 with the contacts 44a2, 46a2 respectively) lie on surfaces of the body portion 40A, while the signal lines C2, C3 (connecting the device 42 with the contacts 44a1, 46a1 respectively) lie within the body portion 40A and are connected to the contacts 44a, 46a1 by means of a conductive plug 55. These signal lines are of course representative of a large plurality of signal lines connecting various devices on the board 40 with contacts.

Figure 7:
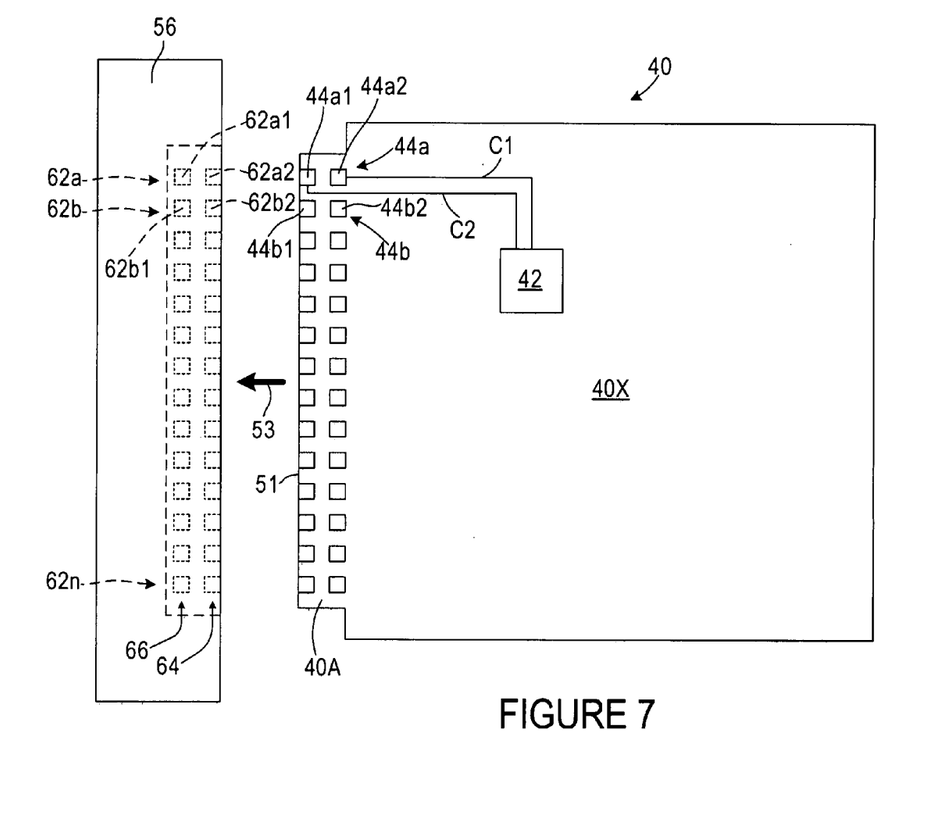
FIG. 7 is a plan view of a side of the present reliability board illustrating insertion of a portion thereof into a connector.
Figure 8:
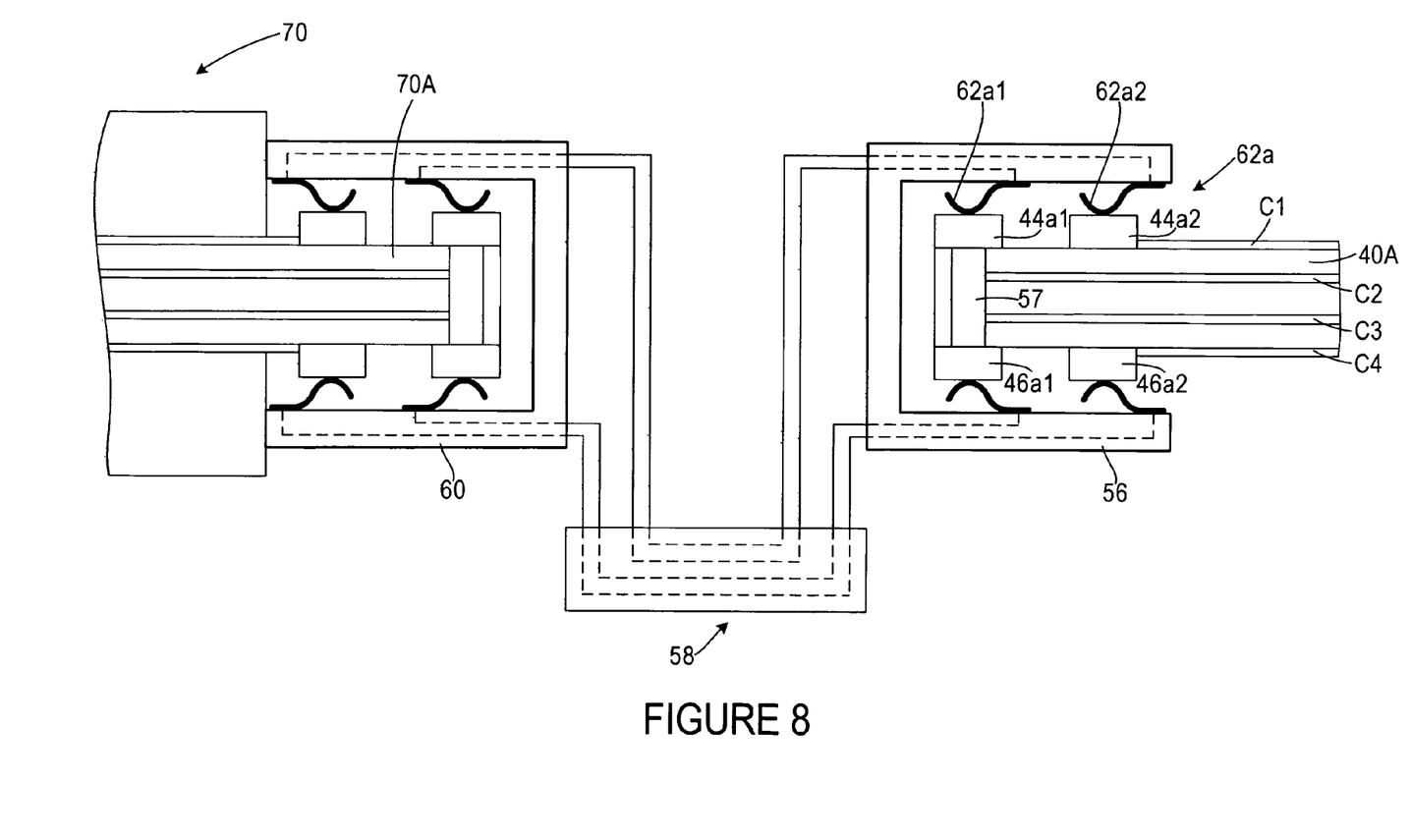
FIG. 8 is a sectional view of illustrating connections of the present reliability board, feed though device, and control module.

The contacts of each contact structure are aligned in the direction of insertion of the body portion 40A into a connector 56 (FIG. 7, arrow 53 indicating direction), for example contact 44a1 and contact 44a2 of contact structure 44a so aligned, contact 44b1 and contact 44b2 of contact structure 44b so aligned, etc. The connector 56 is part of a feed though device 58, which includes another connector 60 electrically connected to the connector 56 (FIG. 8). The connector 56 includes contacts thereon which are configured to engage the respective contacts on the opposite sides 40X, 40Y of the body portion 40A. That is, for example, there is provided a plurality of contact structures 62a, 62b, . . . 62n) on the connector 56. As will be seen, each contact structure on the connector 56 includes a first contact and a second contact spaced from the first contact (for example contact structure 62a includes contacts 62a1, 62a2, contact structure 62b includes contacts 62b1, 62b2, etc.). The contacts of each contact structure are aligned in the direction of insertion 53 of the body portion 40A into the connector 56 (for example contact 62a1 and contact 62a2 so aligned, etc.). The connector 56 includes rows 64, 66 of contacts corresponding to the rows of contacts 52, 54 on the body portion 40A.

A control module 70 also has a portion 70A on which contacts are formed on opposite sides thereof, similar to the contacts on the portion 40A of the board 40. This portion of the module 70 is insertable into the connector 60, which includes a plurality of contacts which engage with respective corresponding contacts on the module portion 70A. In this way, the control module 70 electrically communicates with the devices on the board 40 and may run through testing cycles for running, for example, High Temperature Operating Life test (HTOL), Highly Accelerated Life Test (HAST), and Write Erase Endurance test (ED) of the devices.

It will be seen that in this approach, double the number of contacts are provided, without crowding contacts closer together along the edge of the body portion. Thus contact count is greatly increased without the problem of improper connection of contacts being made as described above.

Figure 9:
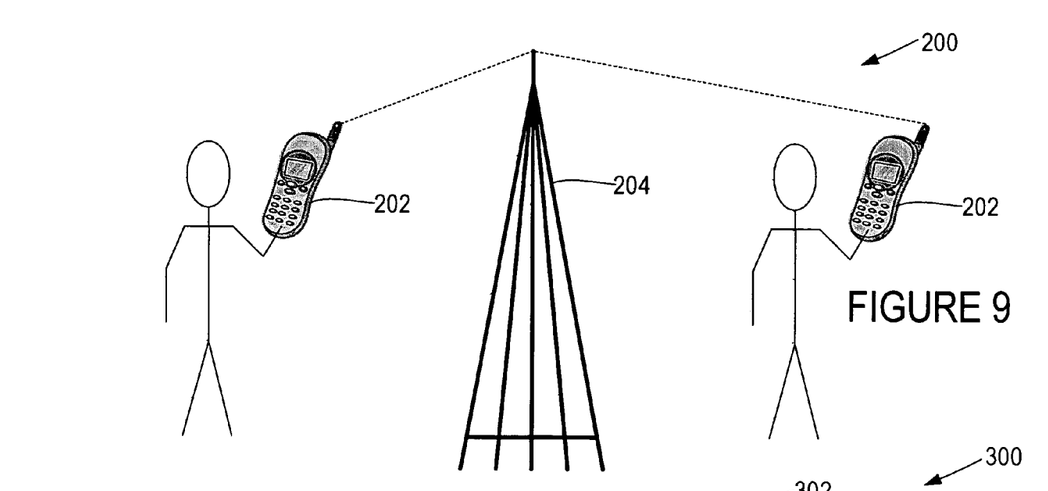
FIGS. 9-11 illustrate systems incorporating the present devices.

FIG. 9 illustrates a system 200 utilizing devices as described above. As shown therein, the system 200 includes hand-held devices 202 in the form of cell phones, which communicate through an intermediate apparatus such as a tower 204 (shown) and/or a satellite. Signals are provided from one cell phone to the other through the tower 204. Such a cell phone with advantage uses devices of the type described above. One skilled in the art will readily understand the advantage of using such devices in other hand-held devices 202 which utilize data storage, such as portable media players, personal digital assistants, digital cameras and the like.

Figure 10:
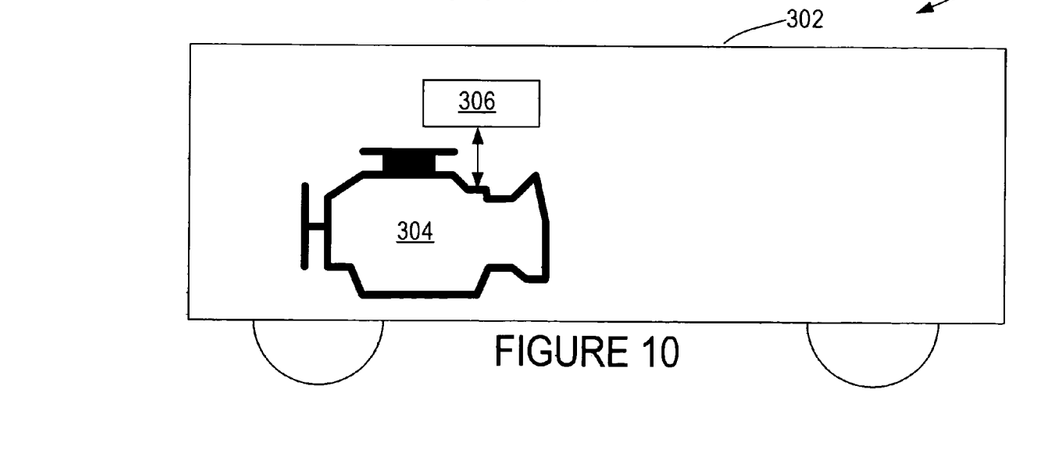

FIG. 10 illustrates another system 300 utilizing devices as described above. The system 300 includes a vehicle 302 having an engine 304 controlled by an electronic control unit 306. The electronic control unit 306 with advantage uses devices of the type described.

Figure 11:
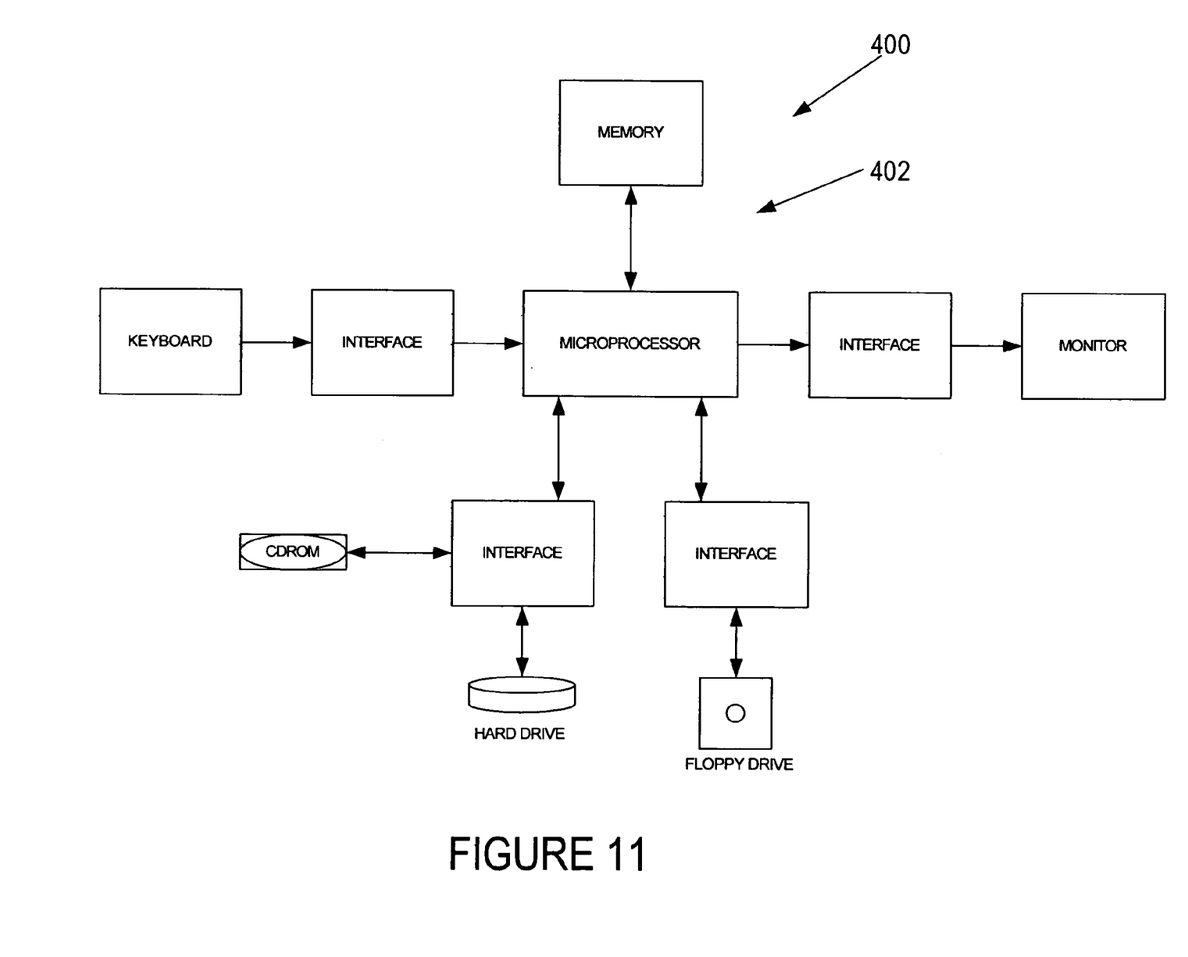

FIG. 11 illustrates yet another system 400 utilizing devices as described above. This system 400 is a computer 402 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. An electronic structure comprising:
   a body having a body portion insertable into a connector and having first and second opposite sides;
   a contact structure on and touching a side of the body portion, the contact structure comprising a first contact and a second contact that is spaced apart from the first contact wherein the first and second contacts of the contact structure are aligned in the direction of insertion of the body portion into the connector;
   a signal line formed inside of the body portion between first and second opposing surfaces of the body portion and coupled to a first and a second plurality of rectangular contacts that are formed to respectively contact the first and second opposing surfaces wherein at least one of each of the first and the second plurality of rectangular contacts are positioned at the end of the body portion and cover first and second opposing surfaces of a conductive plug wherein said conductive plug is centered with respect to said at least one of each of the first and second plurality of rectangular contacts; and
   a signal line formed on each of the first and second opposite sides; and
   wherein the plurality of rectangular contacts cover ending edges of the body portion; and
   wherein the body portion is a printed circuit board.

2. The electronic structure of claim 1 and further comprising the connector, and a contact structure on the connector, the contact structure on the connector comprising a first contact and a second contact spaced from the first contact; the first and second contacts of the contact structure on the connector being aligned in the direction of insertion of the body portion into the connector.

3. The structure of claim 1 and further comprising said structure incorporated in a system.

4. The structure of claim 3 wherein the system is selected from the group consisting of a hand-held device, a vehicle, and a computer.

5. An electronic structure comprising:
a body having a body portion insertable into a connector and having first and second opposite sides;
a plurality of contact structures on and touching a side of the body portion, each contact structure comprising a first contact and a second contact spaced from the first contact;
the first and second contacts of each contact structure being aligned in the direction of insertion of the body portion into the connector;
a signal line formed inside of the body portion between first and second opposing surfaces of the body portion and coupled to a plurality of rectangular contacts that are formed to respectively contact the first and second opposing surfaces wherein at least one of each of the plurality of rectangular contacts are positioned at the end of the body portion and cover first and second opposing surfaces of a conductive plug wherein said conductive plug is centered with respect to said at least one of each of the first and second plurality of rectangular contacts; and
a signal line formed on each of the first and second opposite sides; and
wherein the plurality of rectangular contacts cover ending edges of the body portion; and
wherein the body portion is a printed circuit board.

6. The electronic structure of claim 5 wherein the electronic structure is a board structure.

7. The electronic structure of claim 5 and further comprising a second plurality of contact structures on and touching a side of the body portion opposite the first mentioned side thereof, each contact structure of the second plurality thereof comprising a first contact and a second contact spaced from the first contact, the first and second contacts of each second contact structure being aligned in the direction of insertion of the body portion into the connector.

8. The electronic structure of claim 7 wherein the electronic structure is a board structure.

9. An electronic structure comprising:
a body having a body portion insertable into a connector and having first and second opposite sides;
a first row of contacts on and touching a side of the body portion, and: a second row of contacts on and touching said side of the body portion;
the second row of contacts adjacent to and spaced from the first row of contacts and closer to an edge of the body portion than the first row of contacts;
a signal line formed inside of the body portion between first and second opposing surfaces of the body portion and coupled to a plurality of rectangular contacts that are formed to respectively contact the first and second opposing surfaces wherein at least one of each of the plurality of rectangular contacts are positioned at the end of the body portion and cover first and second opposing surfaces of a conductive plug wherein said conductive plug is centered with respect to said at least one of each of the first and second plurality of rectangular contacts; and
a signal line formed on each of the first and second opposite sides; and
wherein the plurality of rectangular contacts cover ending edges of the body portion; and
wherein the body portion is a printed circuit board.

10. The electronic structure of claim 9 and further comprising a third row of contacts on and touching a side of the body portion opposite the first-mentioned side of the body portion, and a fourth row of contacts on and touching the side of the body portion opposite the first-mentioned side of the body portion, the fourth row of contacts spaced from the third row of contacts and closer to said edge of the body portion than the third row of contacts.

11. The electronic structure of claim 9 and further comprising the connector, and a contract structure on the connector, the contact structure on the connector comprising first and second rows of contacts.

12. The electronic structure of claim 11 wherein the electronic structure is a board structure.

* * * * *